(12) United States Patent
Shi et al.

(10) Patent No.: US 7,595,630 B2
(45) Date of Patent: Sep. 29, 2009

(54) AUTOMATED LASER HEADER TESTING

(75) Inventors: Ting Shi, San Jose, CA (US); Daniel Tran, San Jose, CA (US); Pavel Ploscariu, San Ramon, CA (US)

(73) Assignee: Finisar Corporation, Sunnyvale, CA (US)

( * ) Notice: Subject to any disclaimer, the term of this patent is extended or adjusted under 35 U.S.C. 154(b) by 284 days.

(21) Appl. No.: 11/535,350

(22) Filed: Sep. 26, 2006

(65) Prior Publication Data

US 2007/0069761 A1 Mar. 29, 2007

Related U.S. Application Data

(60) Provisional application No. 60/720,423, filed on Sep. 26, 2005.

(51) Int. Cl.
*G01R 31/28* (2006.01)
(52) U.S. Cl. .................................................. 324/158.1
(58) Field of Classification Search .............. 324/158.1; 376/305, 310, 326
See application file for complete search history.

(56) References Cited

U.S. PATENT DOCUMENTS 6,205,274 B1 * 3/2001 Zhou ........................... 385/38
6,549,602 B2 * 4/2003 Sakamaki ................... 376/305

* cited by examiner

*Primary Examiner*—Ha Tran T Nguyen
*Assistant Examiner*—Trung Q Nguyen
(74) *Attorney, Agent, or Firm*—Workman Nydegger

(57) ABSTRACT

Systems for automated laser header testing are disclosed. A system can include a base portion, a rotary stage supported by the base portion, at least one testing site supported by the rotary stage, and a plurality of testing stations supported by the base portion and radially arranged about a center point of the rotary stage for testing the laser header. Each testing site can include a testing fixture supported by the testing site. The testing fixture can include an air shield providing an isolated environment for testing the laser header. The testing fixture can further include a heat sink and air ducts for controlling testing conditions. Electrical contact members can releasably contact leads of the laser header and a releasing mechanism releases the leads of the laser header from the electrical contact members.

17 Claims, 3 Drawing Sheets

AUTOMATED LASER HEADER TESTING

CROSS-REFERENCE TO RELATED APPLICATIONS

This application claims the benefit of U.S. Provisional Patent Application Ser. No. 60/720,423 entitled "AUTOMATED LASER HEADER TESTING" filed Sep. 26, 2005, the contents of which are hereby expressly incorporated by reference herein.

BACKGROUND OF THE INVENTION

Lasers are used for many different applications. One purpose for which lasers are used is optical communications. Optical communications systems utilize lasers to transmit light to optical waveguides that carry data signals from a source to a destination. Lasers used for optical communication transmission include, for example, double heterostructure (DH), fabry perot (FP) laser diodes, distributed Feedback (DFB) laser diodes, vertical cavity surface emitting lasers (VCSELs), distributed feedback (DFB), Distributed Bragg Reflector (DBR) lasers, as well as other types of lasers.

Lasers can be included within a header. Laser headers are modules containing the active laser within a package enclosure. Laser headers can include other components, such as circuitry for supplying power to the laser and/or optical receivers for monitoring output characteristics of the laser. Laser headers can include different types of packages for encasing and protecting lasers from their operating environment. For example, one type of package is a transistor outline (TO)-Can package. Some packages are hermetically sealed packages. Laser headers can have electrical leads (or pins) that electrically couple the laser within the laser header to an external power source.

Many apparatuses have been used for characterizing output parameters of the laser headers at various environmental conditions. Often, these apparatuses test laser headers at room temperature. However, these testing apparatuses have suffered from several shortcomings. For example, the conventional laser header testing apparatuses have suffered from a lack of automation, lack of flexibility, temperature control limitations, and poor throughput. Thus, what would be advantageous are systems for characterizing laser headers that are more automated, more flexible, allow for more control over testing environment conditions, such as temperature and humidity, and/or improve throughput.

BRIEF DESCRIPTION OF THE DRAWINGS

To further clarify the above and other aspects of the present invention, a more particular description of the invention will be rendered by reference to specific embodiments, aspects which are disclosed in the appended drawings. It is appreciated that these drawings depict only typical embodiments of the invention and are therefore not to be considered limiting of its scope. The invention will be described and explained with additional specificity and detail through the use of the accompanying drawings in which.

SUMMARY OF SEVERAL ILLUSTRATIVE EMBODIMENTS

Figure 1:
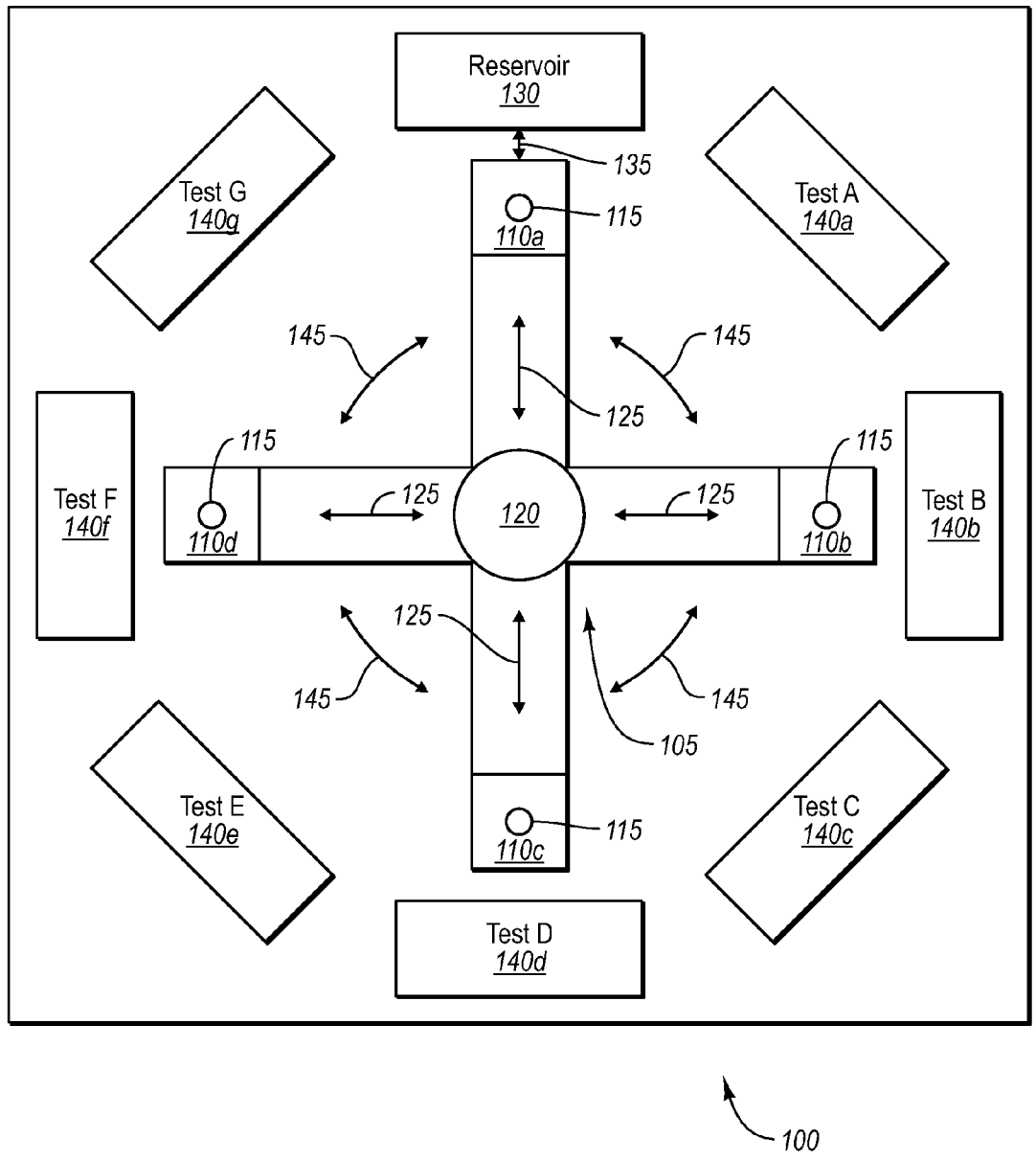
FIG. 1 illustrates a block diagram example embodiment of an automated testing apparatus.

Embodiments disclosed herein relate to testing of laser headers. A laser testing system is disclosed. The laser testing system can include a base portion and a rotary stage supported by the base portion. The rotary stage is configured to rotate about a center axis of the rotary stage. The laser testing system can further include a plurality of testing sites arranged about the rotary stage and configured to receive and test laser headers. The laser testing system can further include a control apparatus configured to control environmental conditions at each testing site.

An automated laser header testing system is disclosed. The automated laser header testing system can include a base portion and a rotary stage supported by the base portion. The automated laser header testing system can include a header socket for receiving a laser header. The header socket can include channels for receiving leads of the laser header. The channels can include a flared opening, wherein a portion of the sidewalls of the channels are removable to expose the leads.

The automated laser header testing system can include at least one testing site, which may or may not be supported by the rotary stage. Each testing site can include a testing fixture. The testing fixture can include an air shield capable of providing an isolated environment for testing the laser header. The testing fixture can further include a thermal control device for conducting heat to or from the laser header. The testing fixture may also include one or more air ducts for controlling conditions of the isolated environment within the air shield. The one or more air ducts can also be configured to conduct heat to and from the laser header. The testing fixture can further include one or more electrical contact members for releasably contacting leads of the laser header. The testing fixture can further include a releasing mechanism for releasing the leads of the laser header from the electrical contact members. The releasing mechanism can include a piston and a cam.

The automated laser header testing system can include a reservoir, which may or may not be supported by the base portion. The reservoir can include a tray for receiving the laser header and header socket, along with other laser headers and other laser sockets. The reservoir can operate in connection with a supply assembly. The supply assembly can include a gantry robot and a positioning camera.

The automated laser header testing system can include a plurality of testing stations supported by the base portion and radially arranged about a center point of the rotary stage for testing the laser header. The testing stations can test the laser header for, among other things, threshold, light-out versus current-in, spatial, spectral, relation oscillations, turn-on delay, modulation response, RIN, SNR, mode partition noise, and/or phase noise characteristics or other characteristics.

DETAILED DESCRIPTION OF EXAMPLE EMBODIMENTS

Embodiments disclosed herein relate to testing of laser headers. Aspects of example embodiments are disclosed with reference to the attached drawings to illustrate the structure and operation of example embodiments used to implement the present invention.

Laser operation characteristics can vary depending on the environmental conditions to which a particular laser is subjected. One aspect of at least one embodiment of the present invention relates to automated testing of laser headers at a wide range of temperatures. One way that at least one embodiment aids in temperature control during testing of laser headers is to facilitate transfer of heat to and/or from the laser header. At least one embodiment includes header sockets, environmental controls such as apparatuses for heating and cooling the laser headers, and/or apparatuses for characterizing the laser headers while they are under such temperature control.

Lasers have various output characteristics, which may vary with environmental factors such as temperatures, duration, and current supply among others. Several embodiments characterize these output and environmental parameters in order to insure that the laser is operating properly and meets industry standards. Some of these operating characteristics can include threshold, chirp, jitter, extinction ratio, rise and fall times, light-out versus current-in, spatial, and spectral characteristics, among others. Transient responses can include relation oscillations, turn-on delay, and modulation response. Noise characteristics can include relative intensity noise (RIN), signal-to-noise ratio (SNR), mode partition noise in multi-mode lasers, and phase noise (which determines line width). At least one embodiment relates to providing various tests for these and other characteristics in an efficient manner that improves accuracy of the various tests conducted on the laser headers and improves throughput of laser headers through the various tests.

Referring to FIG. 1, aspects of an automated testing apparatus 100 for testing laser headers 115 are disclosed according to an example embodiment. The automated testing apparatus 100 can include a rotary stage 105. The rotary stage 105 can include multiple testing sites 110a-110d (hereinafter referred to collectively as 110). For example, the embodiment illustrated in FIG. 1 includes four testing sites 110, each testing site 110 being configured to receive at least one laser header 115 for testing. More generally, rotating stage 105 can include any number of testing sites 110, or only a single testing site 110. As noted above, the testing sites 110 can each receive a laser header 115. Alternatively, or in addition, each testing site 110 can be configured to receive header sockets along with the laser headers 115. Testing sites 110 can be configured in any other fashion that may be required.

In general, the testing sites 110 can control the conditions of the laser header 115 during testing. For example, the testing sites 110 can control the temperature of the laser header 115 during testing. The rotating stage 105 can include a temperature control apparatus 120 for quickly, accurately, and efficiently conducting heat to the laser headers 115 and/or the testing site 110 and/or away from the laser headers 115 and/or testing sites 110. The testing sites 110 can be configured to quickly, efficiently, reliably, and accurately control the temperature of the laser headers 115 during testing.

The testing sites 110 can control conditions of the environment surrounding the laser headers 115 during testing. The temperature control apparatus 120 can include various ducts for circulating liquids, gases, or other heat transfer media to and/or from the testing sites 110 (as indicated by arrows 125) for controlling the temperature of the air around the laser header 115. The testing sites 110 can also control humidity of the air surrounding the laser. The air within the testing sites 110 can also be filtered during testing to remove particulates from the air surrounding the laser headers 115. Excessive humidity may cause undesirable conditions, such as icing, during low temperature testing of the laser headers 115.

In addition to providing control over the conditions of the laser header and the environment surrounding the laser header, the example testing sites 110 can also include mechanisms (see FIG. 3) for securing and releasing the laser headers 115 within the testing sites 110. The securing and releasing mechanisms can receive and secure the laser headers 115. The testing sites 110 can also include connections (see FIG. 4) for providing electrical power and control signals to leads of the laser headers 115 without damaging the laser headers 115.

The automated testing apparatus 100 can include a reservoir 130. The reservoir 130 can include a supply assembly for supplying laser headers 115 to the testing sites 110, and/or for removing laser headers 115 from the testing sites 110 (as indicated by arrow 135). The automated testing apparatus 100 can include multiple reservoirs 130 and supply assemblies for supplying laser headers to multiple testing sites 110 simultaneously or in succession and/or for removing laser headers 115 from the testing sites 110 at multiple locations.

The automated testing apparatus 100 can include several radially arranged testing stations 140a-g (hereinafter referred to collectively as 140) for testing the laser headers 115. The testing stations 140 can test the laser headers 115 for various characteristics. For example, the testing stations 140 can characterize the laser headers 115 for threshold, chirping, jitter, extinction ratio, rise/fall times, data rate, light-out versus current-in, spatial, spectral, relation oscillations, turn-on delay, modulation response, RIN, SNR, mode partition noise (in multi-mode lasers), and phase noise (which determines line width) characteristics among other things. These characteristics can be simultaneously tested by a single or multiple testing sites 110 under various control and environmental conditions, such as those discussed above.

As indicated by arrows 145 in FIG. 1, the rotary stage 105 can rotate in clockwise or counterclockwise directions. The rotary stage 105 can rotate about a central axis, thereby moving the testing sites 110 to the different testing stations 140. At the different testing stations 140, the laser headers 115 can be tested and operational characteristics of the laser headers 115 can be measured and recorded.

For example, in operation, a first testing site 110a can be radially positioned near the reservoir 130 where the supply assembly (see FIG. 2) supplies at least one laser header 115 to the testing site 110a. The first testing site 110a receives the laser header 115 and a securing and releasing mechanism within the first testing site 110a secures the laser header 115 within the first testing site 110a.

The rotary stage 105 can rotate about the central axis into a position where the first testing site 110a is radially positioned proximate to any of the testing stations 140, such as testing station A 140a. Testing station A 140a tests the laser header 115 for at least one characteristic of the laser header 115. After testing station A 140a has completed its testing of the laser header 115, the rotary stage can rotate to another testing station, for example, the rotary stage 105 can rotate about its central axis into a position where the first testing site 110a is radially positioned adjacent to testing station B 140B. Testing station B 140B tests the laser header 115 for at least one characteristic of the laser header 115. After testing station B 140B has completed its testing of the laser header 115, the rotary stage 105 can rotate to another testing station for further testing. The testing processes can be performed in any order. For example, testing can be conducted at testing stations A-G 140a-g in any order. The rotary stage 105 can rotate to any of the testing stations in any sequence and can bypass any of the testing stations 140. The testing can be device specific where predetermined test protocols are conducted in predetermined sequences, and/or the testing protocols and sequences can be user specified or determined dynamically depending on results of other tests or conditions.

After the laser header 115 has had the desired testing completed by one or more of the testing stations 140, the laser header 115 is rotated adjacent to the reservoir 130. The securing and releasing mechanism within the first testing site 110a releases the laser header 115 and the laser header 115 is removed from the first testing site 110a by the supply assembly. The laser header 115 can be stored at the reservoir 130 and associated with results of the various tests conducted on the laser header 115. Test apparatus 100 can be connected to a processor, such as a computer, for operational control as well as for data collection and analysis.

Environmental conditions can be controlled during the testing of the laser header 115. For example, temperature and humidity can be controlled during testing of the laser header 115 at any of the testing stations 140. The control of the temperatures and humidity can be controlled at the testing stations 140 using various apparatuses. For example, once the laser header 115 is secured within the first testing site 110a, the environment within the first testing site 110a can be controlled and modified. The environment can be varied at, or between, the different testing stations 140. For example, the environment can be changed while the laser header 115 is being tested at testing station A 140a. The environment can also be altered before and/or after a test is conducted at or between any of the testing stations 140. The testing environment can be different at each station 140.

The rotary stage 105 can include the second, third, and fourth testing sites 110b-d. The second testing site 110b, for example, can be located on a different side of the rotary stage 105 such that the second testing site 110b is aligned with a different testing station than the first testing site 110a. In addition, the second testing site 110b can be aligned with the reservoir 130 when the first testing site 110a is aligned with a testing station, for example testing station F 140f. In this manner, the second testing site 110b can have laser headers 115 loaded and unloaded while a laser header 115 is under test at the first testing site 110a, for example by testing station F 140f in the embodiment illustrated in FIG. 1.

Additional components can be included in example embodiments of the automated testing apparatus 100. For example, alignment assemblies and devices can be included for positioning the laser headers 115 relative to the testing sites 110, relative to the testing stations 140, and/or for actively monitoring the position of the rotary stage 105. Components can be located at different locations for providing electrical power and/or electrical signals to the laser header, for controlling environmental conditions of the testing sites, or for other purposes. Sensors can also monitor the environment within the testing stations 140.

As illustrated by FIG. 1, the testing apparatus can have various components, mechanisms, and systems for conducting the various functions of the block of the diagram in FIG. 1. For example, referring to FIG. 2, an automated testing apparatus 200 is illustrated. The automated testing apparatus 200 includes a rotary stage 205 supported by a base portion 210. The rotary stage 205 enables rotation of testing sites 215a-b (hereinafter referred to collectively as 215) between several testing stations 220 and a reservoir 225. The reservoir 225 includes several laser headers 230 in header sockets 235 received in a reservoir tray 240. The reservoir tray 240 holds the sockets 235 for supply to the testing sites 215. The laser headers 230 are received by an open portion of the laser sockets 235. The laser sockets 235 provide protection and alignment for the laser headers 230 and can be configured to conduct heat into, and away from, the laser headers 230.

The testing sites 215 can include an air shield 245 for isolating the environment within the testing site 215. The air shields 245a-b can include access holes 252 for allowing the laser headers 230 and header sockets 235 to be placed within the interior of the air shields 245 in a controlled testing environment. The conditions within the testing sites 215 can be individually and collectively controlled such that the laser headers 230 can be tested at various environmental conditions. For example, humidity within the air shields 245 can be eliminated, or at least reduced, such that icing of the laser headers 230 at cold temperatures is not encountered during testing at cold temperatures. The humidity within the air shields 245 can be controlled by pumping "dry" air that has had moisture removed from the air into the air shields 245 such that the moisture content is at an acceptable level. The temperature of the laser headers 230 can also be controlled by heat conducting sinks and ducts within the test sites.

A supply assembly can remove the laser headers 230 and header sockets 235 from the reservoir tray 240 and place the laser headers 230 and sockets 235 into the testing sites 215 for testing at the various testing stations 220. The supply assembly can also remove the laser headers 230 and header sockets 235 from the testing sites 220 and place the laser headers 230 and header sockets 235 back into the reservoir tray 240. In the instance that a result of a test conducted on the laser headers 230 indicates that the laser header 230 does not satisfy a condition, such as an industry standard, the laser header 230 can be discarded by the supply assembly.

Figure 2:
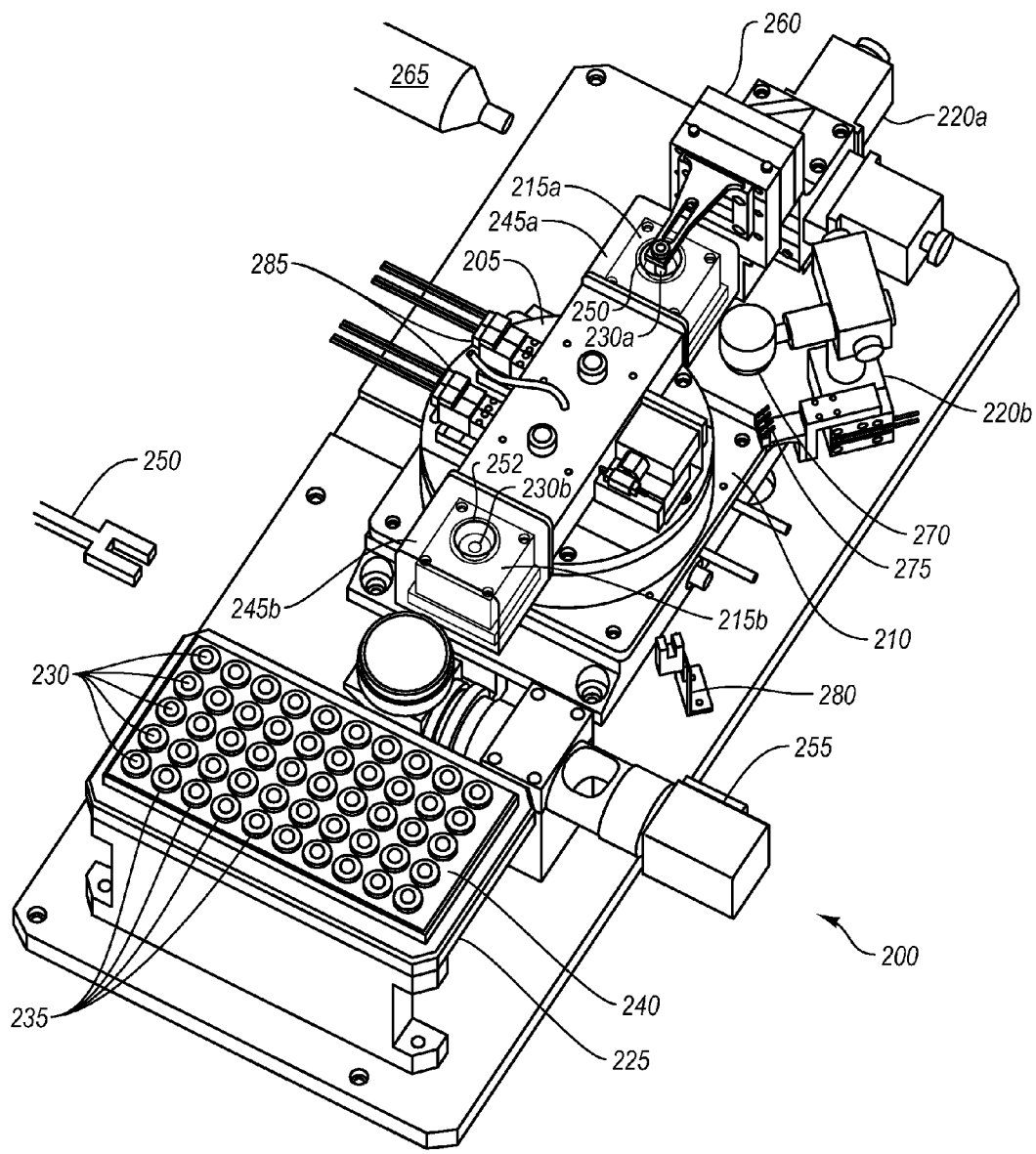
FIG. 2 discloses aspects of an example embodiment of an automated testing apparatus.

According to the example illustrated in FIG. 2, the supply assembly can include a gantry robot 250 and a locating camera 255. The locating camera 255 can be supported by the base portion 210 and enables visual positioning of the laser header 230 and header socket 235 for accurate positioning of the laser header 230 and header socket 235 within the testing sites 215, such as testing site 215b in FIG. 2. The gantry robot 250 can include mechanisms for grasping and moving the laser headers 230 and header sockets 235 in several dimensions. For example, the gantry robot 250 can move the laser headers 230 and header sockets 235 in four dimensions (i.e. x, y, z, and rotational dimensions) such that the laser header 230 and header sockets 235 are aligned and positioned relative to the testing site 215, and the contacts of the laser header 230 are correctly positioned within the testing site 215 for electrical connection to electrical power and control contacts. The locating camera 255 can facilitate such positioning in cooperation with the gantry robot 250, where the locating camera 255 can detect the position and orientation of the laser header 230 and communicate the position and orientation data to the gantry robot 250 for alignment of the laser header 230 and header socket 235 within the testing site 215. The gantry robot 250 and/or locating camera 255 can be parts of the automated testing apparatus 200, or can be separate components from the automated testing apparatus 200 and perform the supply functions described above.

Several testing stations 220 can be supported by the base portion 210 for testing the laser headers 230. The testing stations 220 can test various characteristics of the laser headers 230 for qualification of the laser headers 230 according to various industry standards. A first testing station 220a can be located opposite the reservoir 225. The first testing station 220a can test the laser headers 230 at a first testing site 215a while a laser header 230 is being supplied to, or removed from, a second testing site 215b. The laser header at the second testing site 215b can also be under control of the environment within the air shield 245b of the second testing site 215b such that when the rotary stage 205 is rotated to a position where the second testing site 215b is at the first testing station 220a, the environment within the housing of the second testing site 215b is at the desired environmental conditions. For example, the temperature can be varied between about −40 C. and 100 C. or another suitable temperature range for characterization of the laser header 230 at the second testing site 215b.

The first testing station 220a can include a three dimensional alignment mechanism 260. The three dimensional alignment mechanism 260 can mechanically remove and/or align the laser header 230a relative to a testing device 265. The testing device 265 can include an optical microscope or other testing device for measuring various characteristics of the laser header. The testing device 265 can be a part of the automated testing apparatus 200 or can be separate from the automated testing apparatus 200 and function in conjunction with other mechanisms of the automated testing apparatus, such as the three dimensional alignment mechanism 260. Thus, components of the different testing stations 220 can act in cooperation with mechanisms that are external to the automated testing apparatus 200, but can also work in conjunction with mechanisms and devices that are part of the automated testing apparatus 200. Some of the operating characteristics that can be tested can include threshold, light-out versus current-in, spatial, spectral, relation oscillations, turn-on delay, modulation response, RIN, SNR, mode partition noise (in multi-mode lasers), and phase noise (which determines line width) characteristics.

A second testing station 220b can be located radially about the rotary stage 205 from the first testing station 220a. The second testing station 220b can test the laser headers 230 for different characteristics or at different environmental conditions than the first testing station 220a. For example, the second testing station 220b can include an optical receiver 270 for testing optical power output characteristics of the laser header 215a. The second testing station 220b can further include electrical contacts 275 for electrically coupling an electrical control source to the leads of the laser header 235 and for controlling the current inputs to the laser header 235.

Additional devices can be included on the base portion 210, at the different testing stations 220, on the rotary stage 205, on the base portion 210 and/or at the reservoir 225. For example, a position reference sensor 280 can be located on the base portion 210. The position reference sensor 280 can provide a position reference as to the rotational position of the rotary stage 205 as each of the test sites 215 pass the position reference sensor 280. In this manner, the angular position of the rotary stage 205 can be actively monitored and accurately controlled.

Sensors 285 can also be located on the rotary stage 205. The sensors 285 on the rotary stage 205 can monitor the position of the rotary stage 205, the temperature of the laser headers 230, the humidity within the air shields 245, control current, cycling, and other input controls supplied to the laser headers 215.

Figure 3:
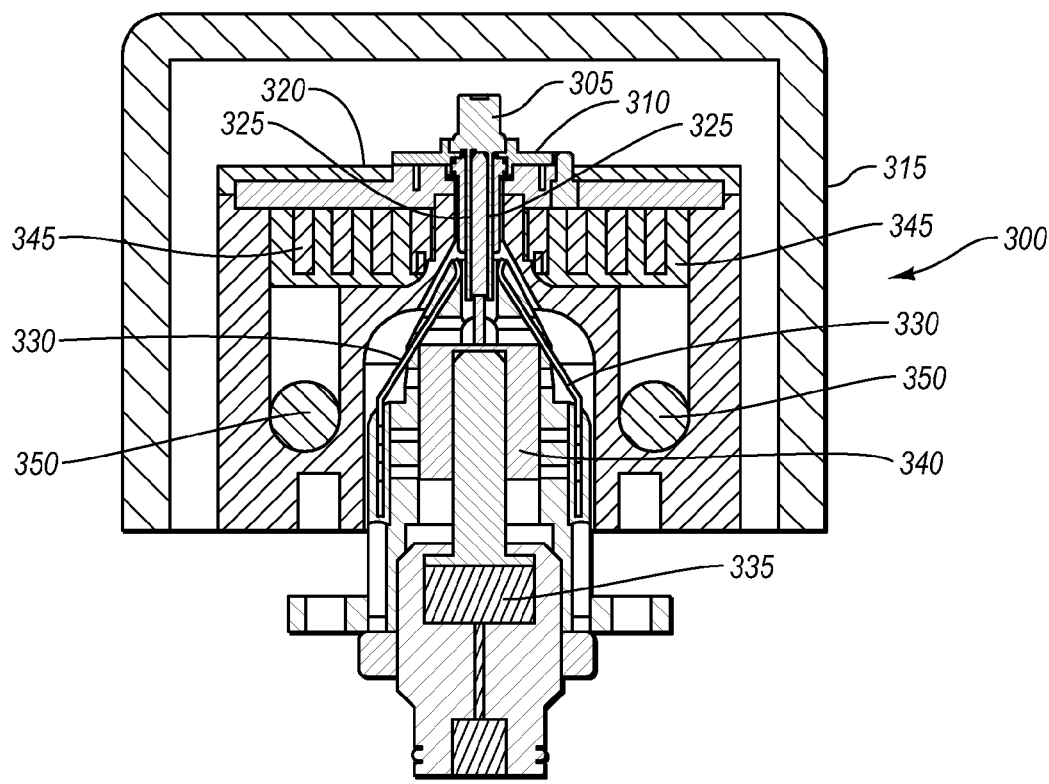
FIG. 3 discloses aspects of an example embodiment of a testing fixture.

Referring to FIG. 3, aspects of an example of a testing fixture 300 for use at a testing site are disclosed. The testing fixture 300 can be located within a testing site of an automated testing apparatus, such as within a testing site 215 of the automated testing apparatus 200 illustrated in FIG. 2. The testing fixture 300 can be configured to receive a laser header 305 and header socket 310 and to secure the laser header 305 and header socket 310 within the testing fixture 300. The testing fixture 300 can be configured to aid in the control of the environment in which the laser header 305 is tested.

The testing fixture 300 can include an air shield 315, which provides an at least partially isolated environment for the laser header 305. The laser header 305 is received by the header socket 310 and the header socket 310 and laser header 305 can be received and secured by an upper portion 320 of the testing fixture 300. Electrical leads 325 from the laser header 305 extend downward into the testing fixture 300 where electrical contact members 330 can contact the electrical leads 325 of the laser header 305. The electrical contact members 330 can be biased inwards toward the electrical leads 325 such that when the laser header 305 and header socket 310 are inserted into the testing fixture 300, the electrical contact members 330 are biased against the electrical leads 325 of the laser header 305, thereby electrically coupling the electrical contact members with the electrical leads 325. The electrical leads 325 can be used for conveying power and electrical signals to the laser header 305

A releasing mechanism can release the electrical leads 325 of the laser header 305 from a secured position within the testing fixture 300. In one example, releasing mechanism can include a piston 335 and cam 340 for applying an outward force to the electrical contact members 330 in opposition to their inward bias, thereby releasing the electrical leads 325 of the laser header 305 from a contact position with the electrical contact member 330. For example, the piston 335 can be mechanically coupled to the cam 340 so as to move the cam 340 in an upward or downward direction. When the piston 335 is retracted, the cam 340 moves downward, allowing the inwardly biased electrical contact members 330 to move inward and engage the electrical leads 325 of the laser header 305. When the piston 335 is extended, the cam 340 moves upward and engages the inwardly biased electrical contact members 330, forcing the electrical contact members 330 outward and out of engagement with the leads 325 of the laser header 305. Thus, the piston 335, cam 340, and electrical contact members 330 can act together to secure or release the laser header 305 and header socket 310 from the testing fixture 300.

A temperature control assembly can control the temperature of the laser header 305 and/or the conditions within the testing fixture 300. The temperature control assembly can control the temperature before, during, and/or after testing of the laser header 305. The temperature control assembly can use conduction, convection, and/or radiation to control the temperature conditions. The temperature control assembly can include several heat sinks 345 for conducting heat to, and from, the laser header 305. The heat sinks 345 can also conduct heat to, and from, the header socket 310. The header socket 310 can conduct heat to, and from, the laser header 305. The heat sinks 345 and the header socket 310 can be made of a material or materials selected to quickly conduct heat, such as copper, although other materials can be implemented. The heat can be conducted to any portion of the laser header 305. For example, the heat can be conducted to the top, bottom, leads and/or other portion(s) of the laser header 305. Sensors within the testing fixture 300 can monitor the temperature, heat conduction rate, rate of temperature change, and other parameters of the temperature control processes and systems. Heat can be supplied to, or removed from, the testing fixture 300 by routing heated or cooled air, or other heat transfer medium, through air ducts 350. The air ducts 350 can be connected to slip air connections of a rotary stage where the air ducts 350 can receive circulated air (or other cooling and/or heating media such as fluids, such as liquids and/or gas) at various temperatures and/or pressures for heating and cooling the laser header 305, for example, by heating and cooling the heat sinks 345. Heat sink 345 can also include fluid-tight connections where the heat transfer medium is a liquid.

The air ducts 350 can also function to facilitate control of other environmental conditions within the testing fixture 300. For example, the air ducts 350 can provide "dry" air to the interior of the testing fixture 300 so as to reduce, or prevent, condensation and/or icing as the laser header 305 is cooled at low temperatures. Thus, the air ducts 350 can facilitate control of multiple testing conditions to which the laser header 305 is subjected, such as both temperature of the laser header and/or humidity of the air within the testing fixture 300.

Figure 4:
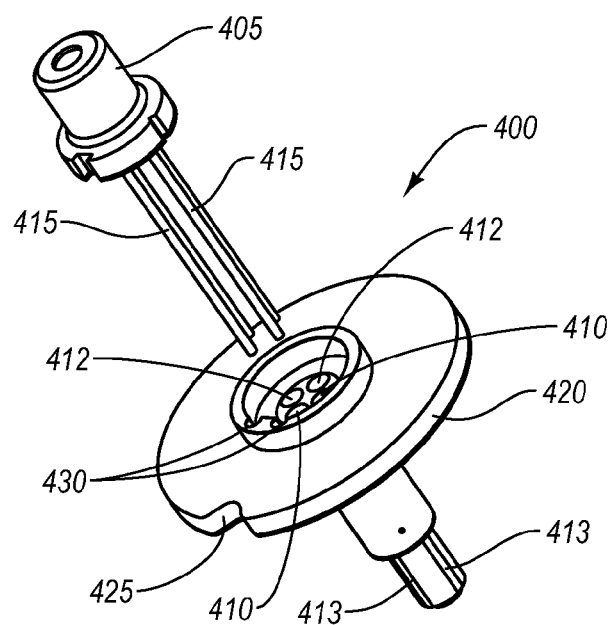
FIG. 4 discloses aspects of an example embodiment of a header socket for receiving a laser header.

Referring now to FIG. 4, aspects of an example header socket 400 for receiving a laser header 405 are disclosed. The header socket 400 can include several channels 410 for receiving leads 415 of the laser header 405. The channels 410 can each include a flared opening 412 for receiving a corresponding lead 415 of the laser header 405 and for directing the lead 415 into the channel 410. At the end of the channels 410 opposite the flared openings 412, the channels 410 can have a portion 413 where their walls are removed so as to expose the leads 415 of the laser header 405 when the laser header 405 is inserted into the header socket 400. In general, the wall portions 413 are removed to the extent necessary in order to expose the leads 415 of the header 405 so that the leads mechanically engage the electrical contacts by way of which power and control signals are transmitted to the laser header 405 during testing. The open portion 413 of the channels 410 can extend along the inner side of the leads 415 so as to apply a static counter force against any biasing contact force such that the leads 415 of the laser header 405 are not deflected inward by the biasing contact force.

The header socket 400 can further include a heat sink 420 for conducting heat to and from the laser header 405. The heat sink 420 can be made of a material that readily conducts heat to, or from, the laser header 405. For example, the heat sink 420 can be made from copper or other material(s) that readily conduct heat. The header socket 400 can include locating means, such as a notch 425 for locating and/or orienting the header socket 400 within another assembly or device, such as the reservoir tray 240 of FIG. 2 and/or the testing fixture 300 of FIG. 3, for example. The header socket 400 can also have additional locating means, such as grooves 430 for locating and/or orienting a laser header 405 as the laser header 405 is received by the header socket 400. In this manner, the laser header 405 can be positioned and oriented when it is received by the header socket 400, and the header socket 400 can be positioned and oriented when it is received by another device or assembly, such as the testing fixture 300 of FIG. 3, for example.

The above example embodiments illustrate apparatuses for automating testing of laser headers. Among other things, these embodiments can improve automation, flexibility, control over testing conditions and/or improve throughput of laser headers.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A testing system comprising:
    a base portion;
    a stage supported by the base portion and configured to rotate about an axis;
    a plurality of testing sites supported by the stage, each of the testing sites being configured to removably receive a laser header;
    at least one testing station supported by the base portion and located near a perimeter of the stage; and
    a control apparatus configured to facilitate control of environmental conditions associated with at least one of the plurality of testing sites, wherein at least one of the at least one testing station is configured to test a laser header for at least one of threshold, light-out versus current-in, spatial, spectral, relation oscillations, turn-on delay, modulation response, RIN, SNR, mode partition noise, and phase noise characteristics.

2. A testing system according to claim 1, further comprising:
    a reservoir located proximate to the stage; and
    a supply operably disposed with respect to the reservoir and one of the plurality of testing sites.

3. A testing system according to claim 2, wherein the reservoir further comprises:
    a tray configured to removably receive a laser header and an associated header socket.

4. A testing system according to claim 1, further comprising:
    a supply assembly for supplying a laser header to the plurality of testing sites, the supply assembly comprising:
    a gantry robot; and
    a positioning camera.

5. A testing system according to claim 1, wherein a testing site further comprises a testing fixture comprising an air shield configured to substantially enclose the laser header when the laser header is received in the testing site.

6. A testing system according to claim 1, wherein a testing site further comprises a testing fixture comprising:
    electrical contact members for releasably contacting leads of a laser header when the laser header is positioned in the test fixture; and
    a release mechanism operably connected with the electrical contact members.

7. A testing system according to claim 6, wherein the release mechanism includes:
    a piston; and
    a cam operably disposed with respect to the piston such that the cam and piston are collectively configured to provide a release force that exceeds a bias force of the electrical contact members.

8. A testing system according to claim 1, wherein the plurality of testing sites and at least one testing station are radially arranged such that a first of the testing sites is aligned with the reservoir when a second of the testing sites is aligned with one of the at least one testing station.

9. A testing system according to claim 1, wherein a testing station includes an optical microscope for measuring characteristics of a laser header.

10. A testing system according to claim 1, wherein at least one of the at least one testing station includes an optical receiver for testing optical power output characteristics of a laser header.

11. A testing system according to claim 1, further comprising a position measuring sensor configured and arranged for active measurement of a position of the stage.

12. A testing system according to claim 1, further comprising a temperature control assembly comprising:
    a heat sink within a first of the plurality of testing sites for conducting heat to and from a header socket, the header socket receiving a laser header and conducting heat to and from the laser header;
    a sensor within a first of the plurality of testing sites for active measurement of temperature, heat conduction rate, and/or rate of temperature change within the first of the testing site; and a duct connected to a slip air connection of the stage, the duct configured to receive air at different temperatures for heating and cooling the laser header within the first of the plurality of testing sites.

13. A testing system comprising:

a base portion;

a stage supported by the base portion and configured to rotate about an axis;

a plurality of testing sites supported by the stage, each of the testing sites being configured to removably receive a laser header;

at least one testing station supported by the base portion and located near a perimeter of the stage; and a control apparatus configured to facilitate control of environmental conditions associated with at least one of the plurality of testing sites, wherein a testing site further comprises a heat sink arranged for thermal communication with the laser header.

14. A testing system according to claim 13, wherein the testing site further comprises ducts for controlling conditions of the isolated environment within the air shield and also for conducting heat to and from the laser header.

15. A testing system according to claim 14, further comprising an air filter configured to remove particulates from the testing environment.

16. A testing system according to claim 14, wherein the ducts control humidity of the air surrounding the isolated environment within the air shield.

17. A testing system comprising:

a base portion;

a stage supported by the base portion and configured to rotate about an axis;

a plurality of testing sites supported by the stage, each of the testing sites being configured to removably receive a laser header;

at least one testing station supported by the base portion and located near a perimeter of the stage;

a control apparatus configured to facilitate control of environmental conditions associated with at least one of the plurality of testing sites; and a sensor for measuring at least one of a temperature of a laser header; humidity at one of the plurality of testing sites; a control current; a cycling rate; and/or an input control supplied to the laser header.

* * * * *

UNITED STATES PATENT AND TRADEMARK OFFICE
CERTIFICATE OF CORRECTION

PATENT NO. : 7,595,630 B2
APPLICATION NO. : 11/535350
DATED : September 29, 2009
INVENTOR(S) : Shi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 287 days.

Signed and Sealed this

Twenty-eighth Day of September, 2010

David J. Kappos
*Director of the United States Patent and Trademark Office*